(12) United States Patent
Kawabata et al.

(10) Patent No.: US 8,274,296 B2
(45) Date of Patent: Sep. 25, 2012

(54) TEST APPARATUS AND ELECTRONIC DEVICE THAT TESTS A DEVICE UNDER TEST

(75) Inventors: Masayuki Kawabata, Saitama (JP); Toshiyuki Okayasu, Saitama (JP)

(73) Assignee: Advantest Corporation, Tokyo (JP)

( * ) Notice: Subject to any disclaimer, the term of this patent is extended or adjusted under 35 U.S.C. 154(b) by 406 days.

(21) Appl. No.: 12/616,451

(22) Filed: Nov. 11, 2009

(65) Prior Publication Data

US 2011/0109321 A1   May 12, 2011

(51) Int. Cl.
*G01R 31/02* (2006.01)
*G01R 31/28* (2006.01)

(52) U.S. Cl. ............... 324/537; 714/738; 341/126

(58) Field of Classification Search .................. None
See application file for complete search history.

(56) References Cited

U.S. PATENT DOCUMENTS

| | | | |
|---|---|---|---|
| 4,583,223 A | 4/1986 | Inoue et al. | |
| 4,608,647 A | 8/1986 | White et al. | |
| 4,857,834 A | 8/1989 | Sukemura | |
| 5,646,521 A | 7/1997 | Rosenthal et al. | |
| 5,749,047 A * | 5/1998 | Cabot | 455/67.14 |
| 6,175,939 B1 | 1/2001 | Dinteman | |
| 6,456,102 B1 | 9/2002 | Mori et al. | |
| 6,628,137 B2 | 9/2003 | Mori et al. | |
| 6,642,736 B2 | 11/2003 | Mori et al. | |
| 6,690,189 B2 | 2/2004 | Mori et al. | |
| 6,714,888 B2 | 3/2004 | Mori et al. | |
| 6,981,192 B2 * | 12/2005 | Panis | 714/740 |
| 7,058,865 B2 | 6/2006 | Mori et al. | |
| 7,343,286 B2 * | 3/2008 | Huang | 704/229 |
| 2002/0062200 A1 | 5/2002 | Mori et al. | |
| 2002/0105353 A1 | 8/2002 | Mori et al. | |
| 2002/0107654 A1 | 8/2002 | Mori et al. | |
| 2002/0108080 A1 | 8/2002 | Mori et al. | |
| 2002/0118017 A1 | 8/2002 | Mori et al. | |
| 2003/0048112 A1 | 3/2003 | Mori et al. | |
| 2004/0177302 A1 | 9/2004 | Mori et al. | |
| 2005/0243894 A1 * | 11/2005 | Chen et al. | 375/139 |
| 2006/0123304 A1 * | 6/2006 | Panis et al. | 714/742 |
| 2009/0039897 A1 | 2/2009 | Fong | |

FOREIGN PATENT DOCUMENTS

| | | |
|---|---|---|
| JP | 2712820 B2 | 2/1998 |
| JP | 10-82838 A | 3/1998 |
| JP | 2839938 B2 | 12/1998 |
| JP | 2001-83216 A | 3/2001 |
| JP | 2002-162450 A | 6/2002 |
| JP | 2002-236149 A | 8/2002 |
| JP | 2002-236150 A | 8/2002 |
| JP | 2002-236152 A | 8/2002 |
| JP | 2002-540431 A | 11/2002 |
| JP | 2004-257898 A | 9/2004 |
| JP | 4291596 B2 | 7/2009 |
| WO | 00/58741 A1 | 10/2000 |

* cited by examiner

*Primary Examiner* — Jeff Natalini
(74) *Attorney, Agent, or Firm* — Chen Yoshimura LLP

(57) ABSTRACT

Provided is a test apparatus that tests a device under test, comprising a digital signal generator that outputs in parallel one or more n-bit digital test signals, where n is an integer greater than or equal to 1; a plurality of driver circuits that are connected respectively to a plurality of digital terminals of the device under test; and an analog signal generator that generates an analog test signal by converting, into an analog signal, an n×m-bit digital multi-bit signal based on the one or more digital test signals output by the digital signal generator to the plurality of driver circuits, where m is an integer greater than or equal to 2.

18 Claims, 16 Drawing Sheets

| CYCLE NUMBER | 1 | 2 | 3 | 4 | 5 | 6 | 7 | 8 | ... |
|---|---|---|---|---|---|---|---|---|---|
| DIGITAL TEST SIGNAL 1 | 0 | 1 | 0 | 1 | 0 | 1 | 0 | 1 | ... |
| DIGITAL TEST SIGNAL 2 | 0 | 0 | 1 | 0 | 0 | 0 | 0 | 0 | ... |
| DIGITAL TEST SIGNAL 3 | 0 | 0 | 1 | 1 | 1 | 1 | 0 | 0 | ... |
| DIGITAL TEST SIGNAL 4 | 1 | 0 | 0 | 0 | 1 | 0 | 1 | 1 | ... |
| DIGITAL TEST SIGNAL 5 | 1 | 1 | 0 | 1 | 0 | 1 | 0 | 0 | ... |
| DIGITAL TEST SIGNAL 6 | 1 | 1 | 1 | 1 | 0 | 0 | 1 | 0 | ... |
| DIGITAL TEST SIGNAL 7 | 1 | 1 | 0 | 0 | 1 | 1 | 0 | 0 | ... |
| DIGITAL TEST SIGNAL 8 | 0 | 0 | 1 | 0 | 0 | 0 | 1 | 1 | ... |
| ANALOG TEST SIGNAL | 120 | 113 | 166 | 165 | 92 | 85 | 168 | 137 | ... |

*FIG. 2A*

| CYCLE NUMBER | 1 | 2 | 3 | 4 | 5 | 6 | 7 | 8 | ... |
|---|---|---|---|---|---|---|---|---|---|
| DIGITAL TEST SIGNAL 1 | 0 | 1 | 0 | 1 | 0 | 1 | 0 | 1 | ... |
| DIGITAL TEST SIGNAL 2 | 0 | 0 | 1 | 1 | 0 | 0 | 1 | 1 | ... |
| DIGITAL TEST SIGNAL 3 | 0 | 0 | 0 | 1 | 1 | 1 | 0 | 0 | ... |
| DIGITAL TEST SIGNAL 4 | 1 | 0 | 0 | 0 | 1 | 1 | 1 | 0 | ... |
| DIGITAL TEST SIGNAL 5 | 1 | 1 | 1 | 0 | 1 | 1 | 0 | 1 | ... |
| DIGITAL TEST SIGNAL 6 | 1 | 1 | 0 | 0 | 0 | 1 | 0 | 0 | ... |
| DIGITAL TEST SIGNAL 7 | 1 | 1 | 1 | 1 | 1 | 0 | 1 | 1 | ... |
| DIGITAL TEST SIGNAL 8 | 0 | 0 | 0 | 1 | 0 | 0 | 0 | 0 | ... |
| ANALOG TEST SIGNAL | 108 | | 83 | | 46 | | 84 | | |

FIG. 2B

| CYCLE NUMBER | 1 | 2 | 3 | 4 | 5 | 6 | 7 | 8 | ... |
|---|---|---|---|---|---|---|---|---|---|
| DIGITAL TEST SIGNAL 1 | 0 | 0 | 0 | 1 | 0 | 1 | 0 | 1 | ... |
| | 0 | 0 | 1 | 0 | 0 | 0 | 0 | 0 | ... |
| DIGITAL TEST SIGNAL 2 | 0 | 0 | 1 | 1 | 1 | 1 | 0 | 0 | ... |
| | 1 | 0 | 0 | 0 | 1 | 0 | 1 | 1 | ... |
| DIGITAL TEST SIGNAL 3 | 1 | 1 | 0 | 0 | 1 | 1 | 0 | 0 | ... |
| | 1 | 1 | 1 | 1 | 0 | 0 | 1 | 1 | ... |
| DIGITAL TEST SIGNAL 4 | 1 | 1 | 0 | 0 | 1 | 1 | 0 | 0 | ... |
| | 0 | 0 | 1 | 1 | 0 | 0 | 1 | 1 | ... |
| ANALOG TEST SIGNAL | 120 | 113 | 166 | 165 | 92 | 85 | 168 | 137 | ... |

*FIG. 2C*

| CYCLE NUMBER | 1 | 2 | 3 | 4 | 5 | 6 | 7 | 8 | ... |
|---|---|---|---|---|---|---|---|---|---|
| DIGITAL TEST SIGNAL 1 | 0 0 | 1 0 | 0 1 | 1 0 | 0 0 | 1 0 | 0 0 | 1 0 | ... |
| DIGITAL TEST SIGNAL 2 | 0 1 | 0 0 | 1 0 | 1 0 | 1 1 | 1 0 | 0 1 | 0 1 | ... |
| DIGITAL TEST SIGNAL 3 | 1 1 | 1 1 | 0 1 | 0 1 | 1 0 | 1 0 | 0 1 | 0 0 | ... |
| DIGITAL TEST SIGNAL 4 | 1 0 | 1 0 | 0 1 | 0 1 | 1 0 | 1 0 | 0 1 | 0 1 | ... |
| ANALOG TEST SIGNAL | 12 6:13 | 4:2 | 13:3 | 12:14 | 2:15 | 0:0 | 14:1 | 10: | ... |

*FIG. 2D*

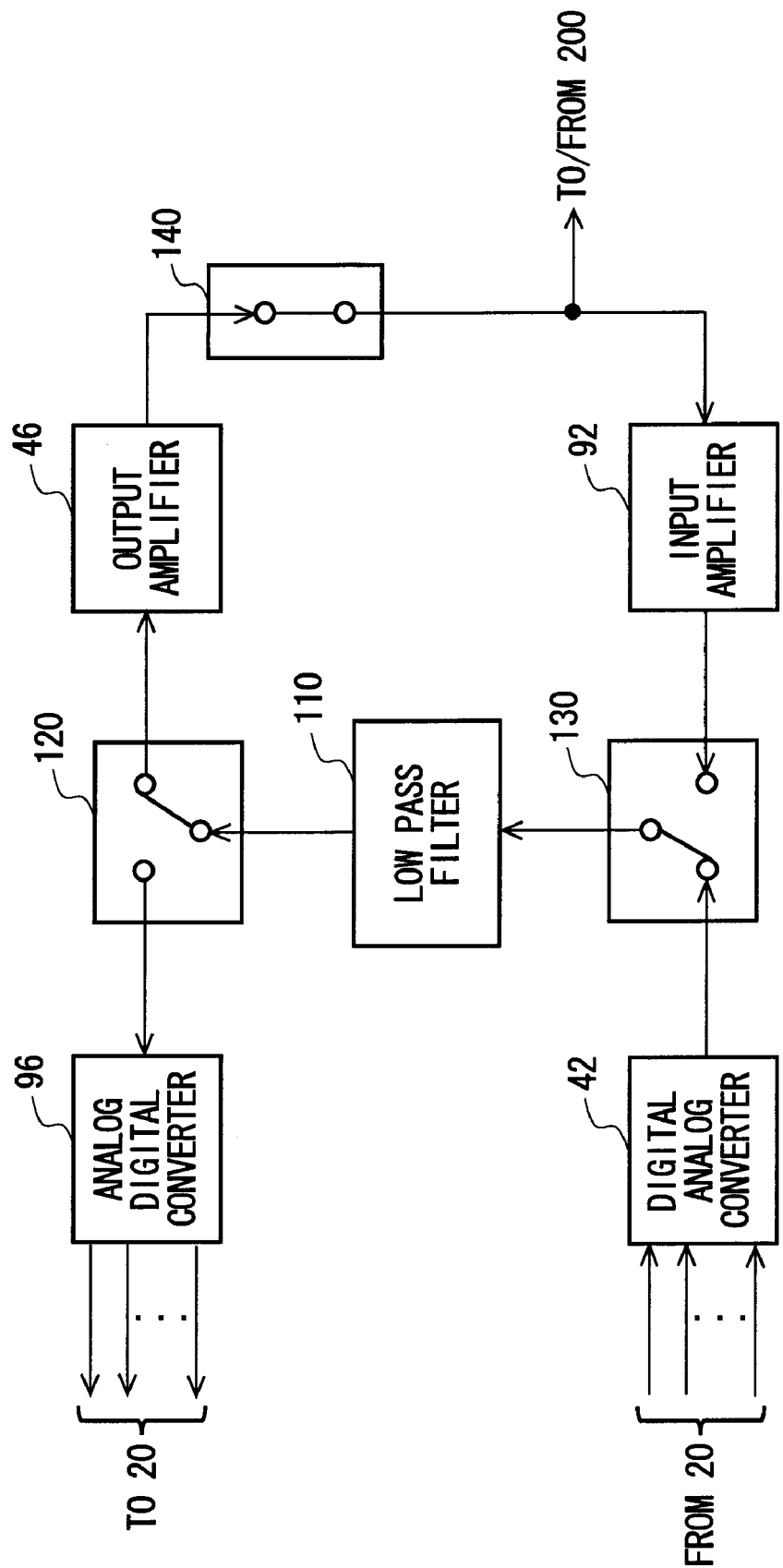

TEST APPARATUS AND ELECTRONIC DEVICE THAT TESTS A DEVICE UNDER TEST

BACKGROUND

1. Technical Field

The present invention relates to a test apparatus and an electronic device. In particular, the present invention relates to an electronic device and a test apparatus for testing a device under test that has digital terminals and an analog terminal.

2. Related Art

A test apparatus inputs a test signal having a prescribed test pattern to a device under test such as an electronic device, and judges acceptability of the device under test by comparing an expected value to a signal output by the device under test in response to the test signal. If the device under test includes a digital circuit and an analog circuit, the test apparatus inputs a digital test signal to the digital circuit and inputs an analog test signal to the analog circuit. The test apparatus is provided with a circuit for generating the digital test signal and a circuit for generating the analog test signal, and therefore the circuit size increases.

WO 2000/058741 discloses a test apparatus that uses a single driver circuit for supplying the device under test both when a digital test signal is input to the device under test and when an analog test signal is input to the device under test. In this test apparatus, the single driver circuit has a digital signal output function and an analog signal output function. Therefore, it is difficult to achieve the required precision for the digital test signal and the analog test signal while restricting the size of the driver circuit. Furthermore, since the analog test signal is generated using the digital test signal pattern input into one digital terminal of the device under test, an analog test signal with a high frequency cannot be generated.

SUMMARY

Therefore, it is an object of an aspect of the innovations herein to provide a test apparatus and an electronic device, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, comprising a digital signal generator that outputs in parallel one or more n-bit digital test signals, where n is an integer greater than or equal to 1; a plurality of driver circuits that are connected respectively to a plurality of digital terminals of the device under test; and an analog signal generator that generates an analog test signal by converting, into an analog signal, an n×m-bit digital multi-bit signal based on the one or more digital test signals output by the digital signal generator to the plurality of driver circuits, where m is an integer greater than or equal to 2.

The test apparatus may further comprise an output timing generator that generates an output timing signal that causes logic values of the one or more digital test signals to change, and the digital signal generator may input the digital multi-bit signal to the analog signal generator and the plurality of driver circuits based on the output timing signal.

The analog signal generator may convert the digital multi-bit signal into the analog test signal at an edge timing of one digital test signal from among the one or more digital test signals. The analog signal generator may convert the digital multi-bit signal into the analog test signal with a period that is 1/n times a bit period of the one or more digital test signals. The analog signal generator may acquire the output timing signal from the output timing generator and convert the digital multi-bit signal into the analog test signal at an edge timing of the output timing signal. The analog signal generator may generate a digital multi-bit signal for each n×m-bit period, based on an n-bit-wide digital test signal input to one of the plurality of driver circuits.

The test apparatus may further comprise a plurality of comparators that receive signals output from the digital terminals of the device under test and each output a comparison result between a voltage of the received signal and a prescribed threshold voltage; a plurality of digital signal comparing sections that each output comparison data obtained by comparing a respective one of the comparison results to a prescribed expected value; a plurality of storage sections that each store corresponding comparison data; and an analog signal receiver that (i) receives an analog signal output from an analog output terminal of the device under test, (ii) converts the analog signal into a k×m-bit digitally-converted signal, where k is an integer greater than or equal to 1, and (iii) inputs, to each of the plurality of digital signal comparing sections, divided data obtained by dividing the digitally-converted signal into m portions, and each digital signal comparing section may store the divided data in one or more of the plurality of storage sections. Instead, each digital signal comparing section may store in one or more of the plurality of storage sections comparison data obtained by comparing the divided data to the prescribed expected value.

The analog signal generator may include a digital-analog converter and a low pass output filter, the digital-analog converter may convert the digital multi-bit signal into the analog test signal and input the analog test signal to an analog input terminal of the device under test via the low pass output filter, the analog signal receiver may include a low pass input filter and an analog-digital converter, and the analog-digital converter may receive the analog signal output from the analog terminal of the device under test via the low pass input filter and convert the analog signal into the digitally-converted signal according to an input timing signal that is synchronized with a logic value change timing of the signals output from the digital terminals.

The test apparatus may comprise a low pass filter that functions as the low pass output filter and the low pass input filter, wherein when the analog test signal is input to the analog terminal of the device under test, the low pass filter receives the analog test signal output from the digital-analog converter and outputs the analog test signal to the analog terminal, and when the analog signal output from the analog terminal of the device under test is received, the low pass filter receives the analog signal received from the analog terminal and outputs the analog signal to the analog-digital converter.

The test apparatus may further comprise an input switching section that switches whether an output signal of the digital-analog converter or an output signal of the analog terminal is input to the low pass filter; and an output switching section that switches whether the signal output by the low pass filter is input to the analog-digital converter or to the analog terminal, wherein when the analog signal generator inputs the analog test signal to the analog terminal, the input switching section inputs the output signal of the digital-analog converter into the low pass filter and the output switching section inputs the signal output by the low pass filter into the analog terminal, and when the analog signal receiver receives the signal output by the analog terminal, the input switching section inputs the output signal of the analog terminal into the low pass filter and the output switching section inputs the signal output by the low pass filter into the analog-digital converter.

The test apparatus may further comprise an input/output switching section that switches whether the analog signal generator is connected to the analog terminal, wherein when the input/output switching section connects the analog signal generator to the analog terminal, the input switching section inputs the output signal of the digital-analog converter into the low pass filter and the output switching section inputs the signal output by the low pass filter into the analog terminal, and when the input/output switching section does not connect the analog signal generator to the analog terminal, the input switching section inputs the output signal of the analog terminal into the low pass filter and the output switching section inputs the signal output by the low pass filter into the analog-digital converter.

According to a second aspect related to the innovations herein, one exemplary test apparatus may comprise a plurality of comparators that receive signals output from digital terminals of a device under test and each output a comparison result between a voltage of the received signal and a prescribed threshold voltage; a plurality of digital signal comparing sections that each output comparison data obtained by comparing a respective comparison result to a prescribed expected value; a plurality of storage sections that each store corresponding comparison data; and an analog signal receiver that (i) receives an analog signal output from an analog output terminal of the device under test, (ii) converts the analog signal into a k×m-bit digitally-converted signal, where k is an integer greater than or equal to 1, and (iii) inputs, to each of the plurality of digital signal comparing sections, divided data obtained by dividing the digitally-converted signal into m portions, and each digital signal comparing section stores the divided data in one or more of the plurality of storage sections. Instead, each digital signal comparing section stores in one or more of the plurality of storage sections comparison data obtained by comparing the divided data to the prescribed expected value.

According to a second aspect related to the innovations herein, one exemplary electronic device may comprise a digital signal generator that outputs in parallel one or more n-bit digital test signals, where n is an integer greater than or equal to 1; a plurality of driver circuits that are connected respectively to a plurality of digital terminals of the device under test; and an analog signal generator that generates an analog test signal by converting, into an analog signal, a n×m-bit digital multi-bit signal based on the one or more digital test signals output by the digital signal generator to the plurality of driver circuits, where m is an integer greater than or equal to 2.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2A shows an exemplary relationship between the digital test signals and the analog test signal.

FIG. 2B shows the analog test signal obtained by converting the digital multi-bit signal at the edge timing of one of the digital test signals shown in FIG. 2A.

FIG. 2C shows the analog test signal generated when the digital test signals are 2 bits wide.

FIG. 2D shows another example of the analog test signal generated when the digital test signal is 2 bits wide.

FIG. 10A shows another exemplary configuration of the analog signal generator 40 and the analog signal receiver 90.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
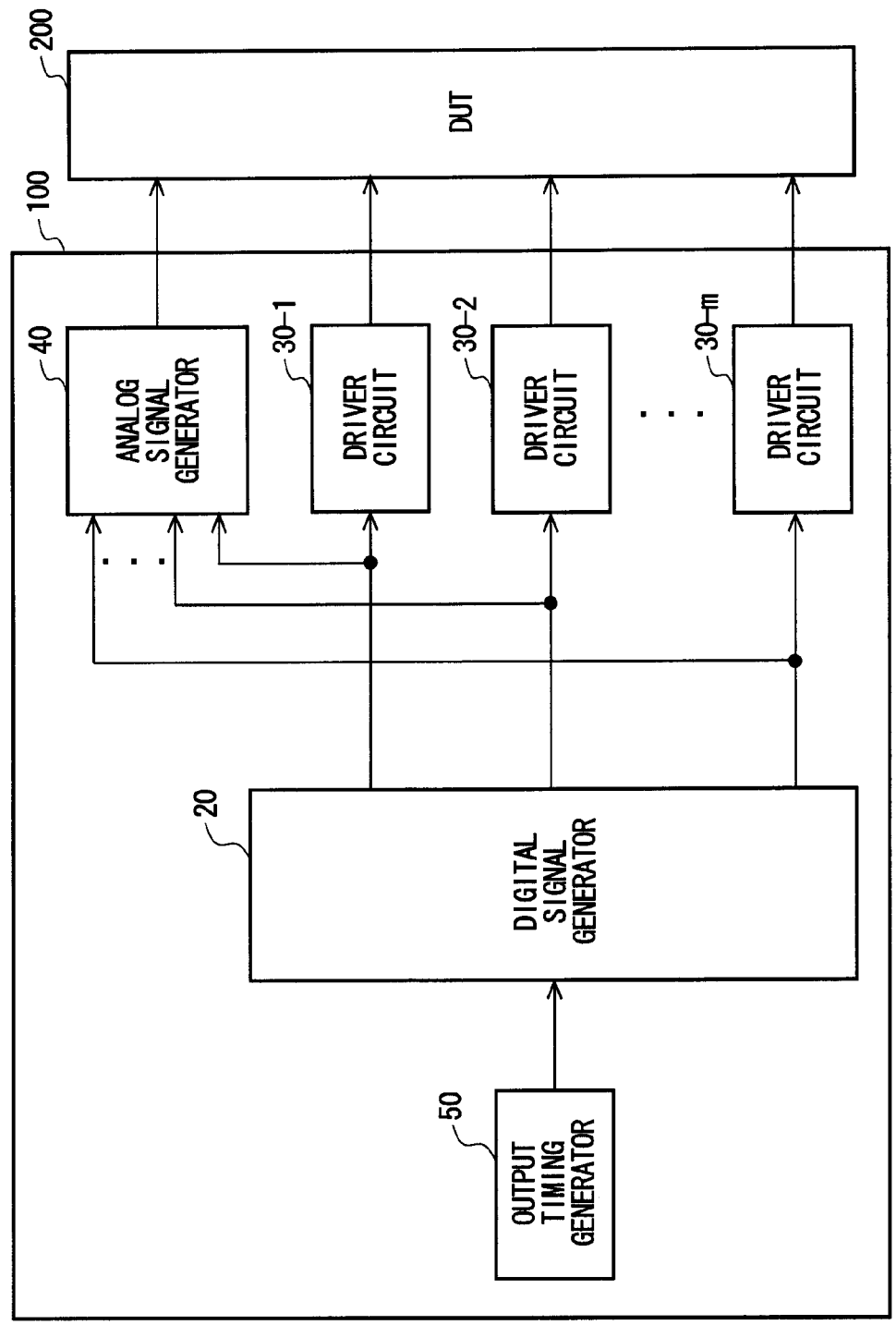
FIG. 1 shows an exemplary configuration of a test apparatus 100 according to an embodiment of the present invention, along with a device under test 200.

FIG. 1 shows an exemplary configuration of a test apparatus 100 according to an embodiment of the present invention, along with a device under test 200. The test apparatus 100 inputs a test signal to the device under test 200. The test apparatus 100 judges acceptability of the device under test 200 based on a signal output by the device under test 200 in response to the test signal.

The test apparatus 100 inputs, to a plurality of digital terminals of the device under test 200, a digital test signal having a logic value that changes according to a test pattern stored in advance in a memory or the like. The test apparatus 100 may judge the acceptability of a digital circuit in the device under test 200 by comparing a prescribed expected value to the digital signal output from a digital terminal of the device under test 200 in response to the digital test signal.

The test apparatus 100 inputs a prescribed analog test signal to an analog terminal of the device under test 200. The test apparatus 100 may judge the acceptability of an analog circuit in the device under test 200 by comparing a prescribed expected value to the analog signal output from the analog terminal of the device under test 200 in response to the analog test signal.

The test apparatus 100 includes a digital signal generator 20, m driver circuits 30-1 to 30-m, an analog signal generator 40, and an output timing generator 50. Here, m is an integer greater than 1. The digital signal generator 20 outputs one or more n-bit digital test signals in parallel. Here, n is an integer greater than or equal to 1. The digital signal generator 20 generates a digital test signal having a logic value that changes between 0 and 1, for example, according to the test pattern stored in advance in the memory. The digital signal generator 20 may output, to each of the digital terminals of the device under test 200, a one-bit-wide digital test signal with a voltage that sequentially changes to correspond to logic values of 0 and 1.

The digital signal generator 20 may output a digital signal with a multi-bit width corresponding to each of the digital terminals of the device under test 200. For example, if n=2, the digital signal generator 20 outputs a digital test signal having $n^2=4$ logic values.

The digital signal generator 20 may include, in a portion of the bits in the multi-bit width, a signal for controlling the driver circuits 30. For example, the digital signal generator 20 may use 1 bit from among the multi-bit width to control whether a driver circuit 30 is enabled.

The driver circuits 30 are connected respectively to the digital terminals of the device under test 200. Each driver circuit 30 receives the digital test signal from the digital signal generator 20, and inputs the digital test signal to the corresponding digital terminal of the device under test 200.

The analog signal generator 40 is connected to the digital signal generator 20 in parallel with the driver circuits 30. The analog signal generator 40 generates the analog test signal by converting, into an analog signal, a digital multi-bit signal having n×m bits based on the digital test signal output by the digital signal generator 20. The analog signal generator 40 inputs the generated analog test signal to the analog terminal of the device under test 200.

More specifically, the analog signal generator 40 receives the n-bit-wide digital multi-bit signal output to the m driver circuits 30 by the digital signal generator 20. For example, if n=1, the analog signal generator 40 receives an m-bit wide digital multi-bit signal in which the least significant bit is the digital test signal corresponding to the driver circuit 30-1 and the most significant bit is the digital test signal corresponding to the driver circuit 30-m.

The analog signal generator 40 converts this digital multi-bit signal into an analog signal at constant time intervals. For example, the analog signal generator 40 may generate an analog test signal having $2^m$ levels from the m-bit digital multi-bit signal. More specifically, if n=1 and m=8, the analog signal generator 40 generates an analog test signal having $2^x=256$ levels.

If a voltage width of 0.01 V corresponds to one level, the analog signal generator 40 may receive 8-bit-wide data and generate an analog test signal with a voltage no less than 0 V and no greater than 2.55 V. For example, if the analog signal generator 40 receives data "10000000" from the digital signal generator 20, the analog signal generator 40 generates the analog test signal with a voltage of 1.28 V.

The analog signal generator 40 may generate the analog test signal with a number of levels corresponding to the value of $2^{n \times m}$. For example, if n=2 and m=6, the analog signal generator 40 generates the analog test signal with $2^{12}=4096$ levels. The analog signal generator 40 may generate the analog test signal having a voltage obtained by multiplying a voltage difference corresponding to a single level by the value of the digital multi-bit signal. The analog signal generator 40 may convert the digital multi-bit signal into an analog test signal whose voltage value changes non-linearly with respect to the digital multi-bit signal, based on a table that stores voltage values corresponding to values of the digital multi-bit signal.

The analog signal generator 40 can generate the analog test signal having a frequency corresponding to the time interval, by receiving the digital test signal at constant time intervals and converting the digital test signal into the analog test signal. For example, if the digital signal generator 20 outputs a digital test signal with a frequency of 1 GHz, the analog signal generator 40 can generate the analog test signal having a frequency no greater than 500 MHz, as made clear from the sampling theorem.

The output timing generator 50 generates an output timing signal that changes the logic value of the digital test signal. The digital signal generator 20 may input the digital test signal to the analog signal generator 40 and the driver circuits 30, based on the output timing signal. For example, if the operational frequency of the device under test 200 is 1 GHz, the output timing generator 50 generates the output timing signal in which an edge occurs every 1 ps at a period of 1 GHz. The digital signal generator 20 generates the digital test signal in which the logic value changes according to the test pattern at an edge timing of the output timing signal.

For example, the analog signal generator 40 may convert the digital multi-bit signal into the analog test signal at one edge timing of the digital test signal. More specifically, the analog signal generator 40 may convert the n×(m−1)-bit-wide digital multi-bit signal corresponding to the driver circuits from 30-2 to 30-m into the analog test signal at an edge timing of the digital test signal input to the driver circuit 30-1. For example, if a digital test signal with a pattern "010101 . . . " is input to the driver circuit 30-1, the analog signal generator 40 may convert the digital multi-bit signal into the analog test signal at a timing at which the logic value of the digital test signal transitions from 0 to 1.

In this way, the test apparatus 100 can generate the analog test signal using the digital test signals input to the plurality of digital terminals of the device under test 200. In other words, when testing a device under test 200 including an analog circuit, the test apparatus 100 functions as an arbitrary waveform generator. Since the analog signal generator 40 shares the digital signal generator 20 with the plurality of driver circuits 30, the circuit size of the test apparatus 100 decreases.

Accordingly, while restricting the circuit size, the test apparatus 100 can optimally distribute the ratio between the number of analog test signals and the number of digital test signals output simultaneously, according to the test content of the device under test 200. Furthermore, the test apparatus 100 can have characteristics suitable for testing the analog circuit of the device under test 200, and can output an analog test signal with a high frequency.

The test apparatus 100 may select the number of driver circuits 30 shared with the analog signal generator 40 according to the number of digital terminals and analog terminals in the device under test 200. Instead, the test apparatus 100 may select the number of driver circuits 30 shared with the analog signal generator 40 according to the voltage values and number of levels of the analog test signal necessary for testing the device under test 200.

FIG. 2A shows an exemplary relationship between the digital test signals and the analog test signal. FIG. 2A shows an example in which n=1 and m=8. In FIG. 2A, the cycle number indicates the ordinal number of the piece of data from the initiation of output of the digital test signal by the digital signal generator 20. The digital test signal k represents the digital test signal input to the driver circuit 30-k.

In FIG. 2A, the analog signal generator 40 converts the digital multi-bit signal into the analog test signal at each timing at which the logic value of the digital test signals change. For example, in cycle number 1, the digital multi-bit signal that is obtained by multiplexing the digital test signals corresponding to the driver circuits from 30-1 to 30-8 is "01111000."

The analog signal generator 40 generates the analog test signal having a voltage value obtained as a product of the digital multi-bit signal and the voltage width of one level. Here, "01111000" is the binary representation of the base 10 value 120. Accordingly, if the voltage width per level is 0.01 V, the analog signal generator 40 may generate the analog test signal having a voltage of 1.2 V in this cycle.

For each following cycle, the analog signal generator 40 converts the digital multi-bit signal into the analog test signal having a voltage that corresponds to the value of the digital multi-bit signal. In other words, the analog signal generator 40 generates the analog test signal having a voltage value that sequentially changes according to the product of 0.01 V and the values 113, 166, 165, 92, and so on. In this way, the analog signal generator 40 can generate the analog test signal using digital test signals corresponding to the plurality of driver circuits 30.

FIG. 2B shows the analog test signal obtained by converting the digital multi-bit signal at the edge timing of one of the digital test signals shown in FIG. 2A. The analog signal generator 40 converts the 7-bit digital multi-bit signal output by the driver circuits from 30-2 to 30-8 into the analog test signal, at the edge timing at which the digital test signal input to the driver circuit 30-1 changes from 0 to 1.

For example, between cycle numbers 1 and 2, the digital test signal 1 input to the driver circuit 30-1 changes from 0 to 1. The analog signal generator 40 generates the analog test signal having a voltage value corresponding to the 7-bit-wide data "0111100" from the digital signal 2 to the digital signal 8.

In FIG. 2B, the analog signal generator 40 generates the analog test signal having a voltage that sequentially changes according to the product of 0.01 V and the values 108, 83, 46, and 84, which are obtained by converting the 7-bit-wide digital multi-bit data into base 10. In comparison to FIG. 2A, the number of levels decreases from 256 to 128, and the frequency of the generated analog test signal decreases to ½ of the frequency value in FIG. 2A.

FIG. 2C shows the analog test signal generated when the digital test signals are 2 bits wide. In FIG. 2C, the analog signal generator 40 converts into the analog test signal the 2×4-bit digital multi-bit signal input to the driver circuits from 30-1 to 30-4.

For example, in cycle number 1, the analog signal generator 40 receives 2-bit data "00," "10," "11," and "01" respectively corresponding to the driver circuits from 30-1 to 30-4. The analog signal generator 40 may set the digital multi-bit signal to be "01111000" based on these pieces of 2-bit data. The analog signal generator 40 generates the analog test signal having a voltage corresponding to the data "01111000" of the digital multi-bit signal.

FIG. 2D shows another example of the analog test signal generated when the digital test signal is 2 bits wide. If the digital test signal output by the digital signal generator 20 is n bits wide, the analog signal generator 40 may convert the digital multi-bit signal into the analog test signal with a period that is 1/n times the bit period of the digital test signals. Here, the bit period of the digital test signals refers to the minimum duration between timings at which the logic value of the digital test signals change. In FIG. 2D, the analog signal generator 40 converts the digital multi-bit signal into the analog test signal at a timing interval that is ½ of the timing interval at which the logic value of the digital test signals change.

More specifically, the analog signal generator 40 performs parallel or serial conversion on the digital test signals received from the digital signal generator 20 that correspond respectively to the driver circuits 30. The analog signal generator 40 converts the 4-bit digital multi-bit signal, obtained from the parallel or serial conversion, into the analog test signal.

For example, in cycle number 1, the analog signal generator 20 receives 2-bit data pieces "00," "10," "11," and "01" corresponding to the driver circuits from 30-1 to 30-4. In this cycle, the analog signal generator 20 generates the analog test signal having a voltage that corresponds to the 4-bit data resulting from the least significant bit of each piece of 2-bit data. Next, in the same cycle, the analog signal generator 40 generates the analog test signal having a voltage that corresponds to the 4-bit data resulting from the most significant bit of each piece of 2-bit data. As a result, the analog signal generator 40 can generate the analog test signal with a frequency that is higher than the frequency of the digital test signal.

Figure 3:
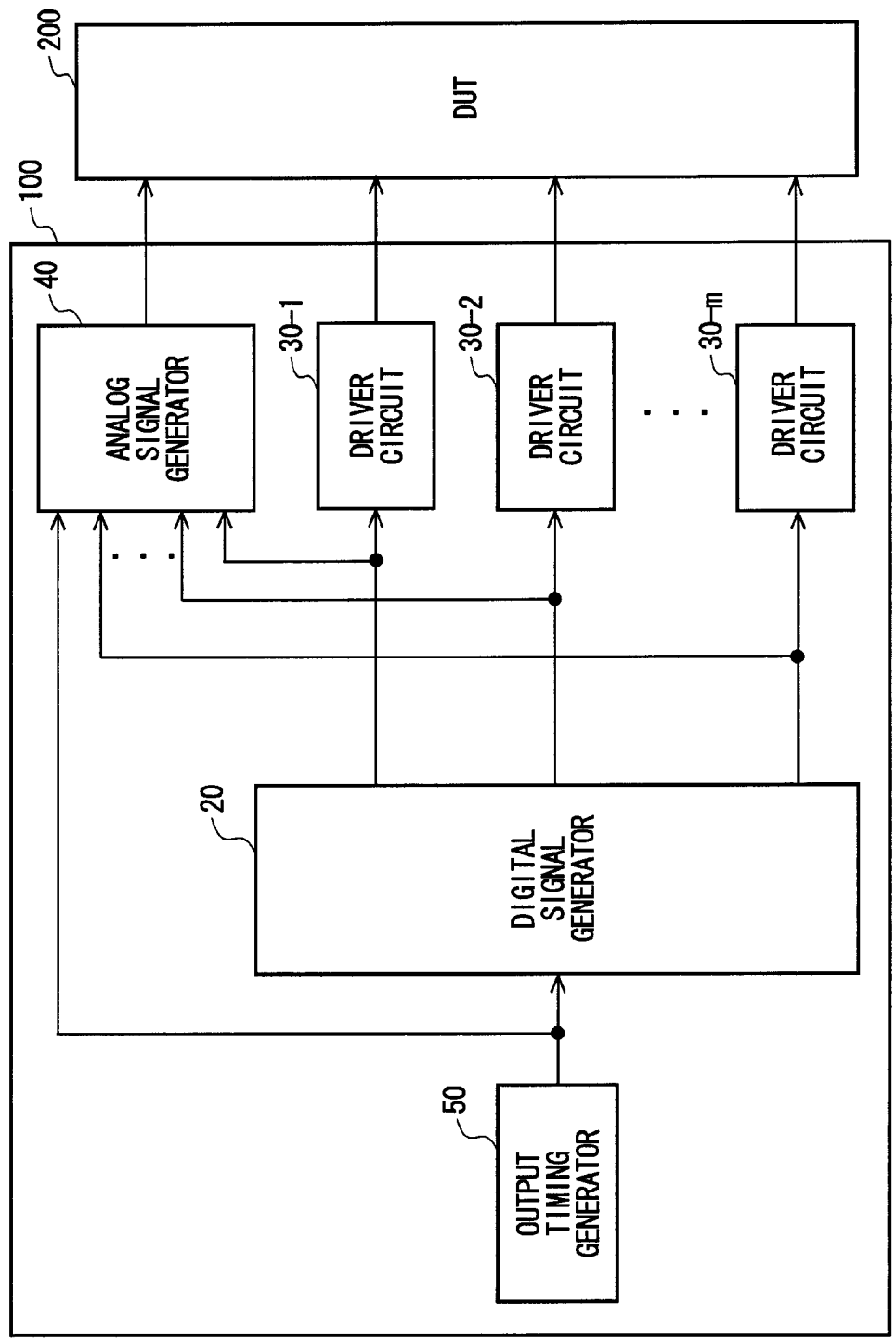
FIG. 3 shows another exemplary configuration of the test apparatus 100.

FIG. 3 shows another exemplary configuration of the test apparatus 100. In FIG. 3, the analog signal generator 40 acquires the output timing signal from the output timing generator 50. The analog signal generator 40 converts the digital multi-bit signal into the analog test signal at an edge timing of the output timing signal acquired from the output timing generator 50. In this configuration, the analog signal generator 40 can generate the analog test signal using all of the digital test signals output by the digital signal generator 20, and can therefore increase the number of levels of the analog test signal compared to the configuration of FIG. 1.

Figure 4:
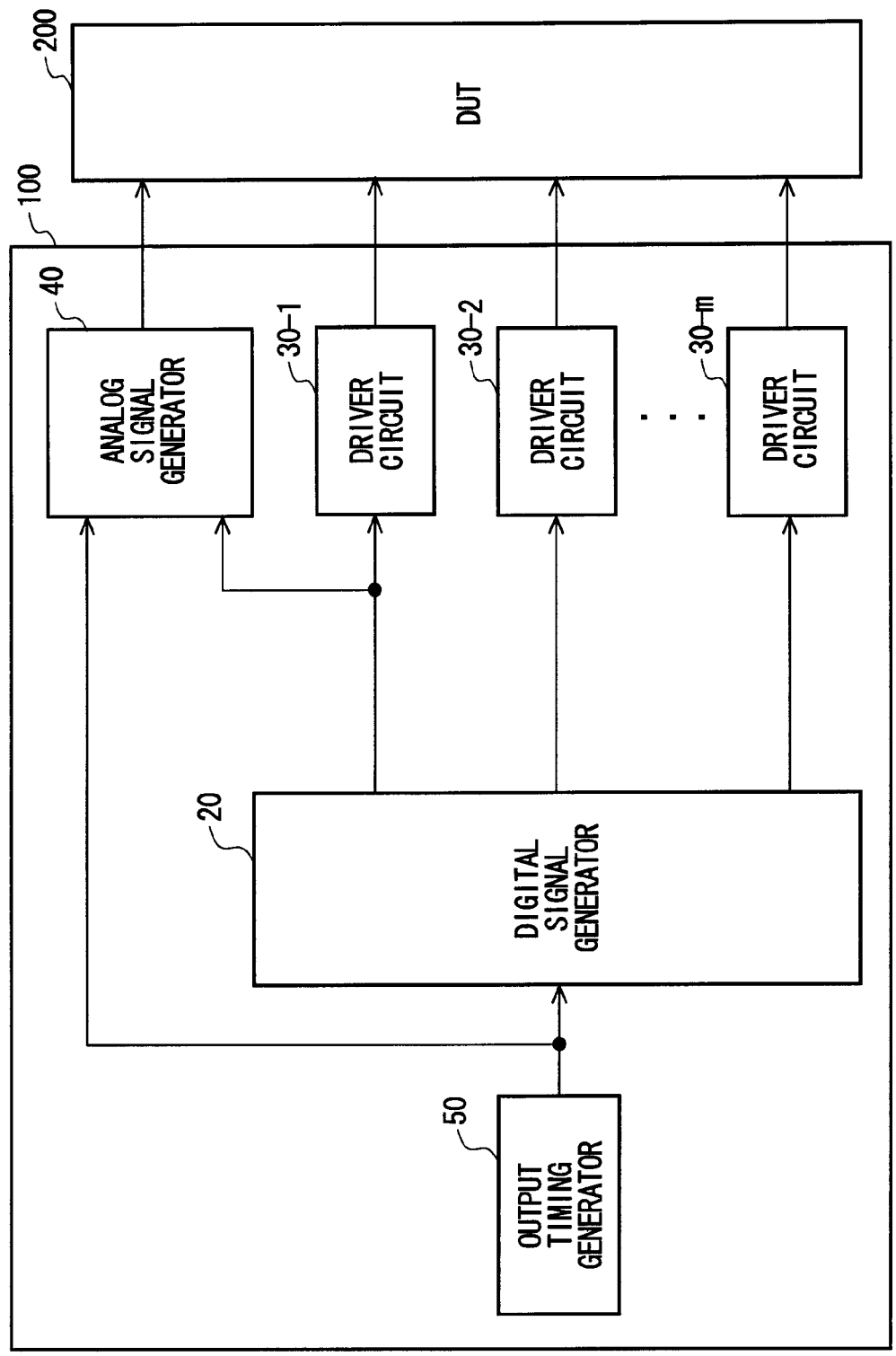
FIG. 4 shows another exemplary configuration of the test apparatus 100.

FIG. 4 shows another exemplary configuration of the test apparatus 100. In FIG. 4, the analog signal generator 40 converts a multi-bit-wide digital test signal input to the driver circuit 30-1 into the analog test signal, at an edge timing of the output timing signal output by the output timing generator 50. For example, if the digital signal generator 20 outputs an 8-bit-wide digital test signal to the driver circuit 30-1, the analog signal generator 40 can generate the analog test signal having 256 levels based on this digital test signal.

The analog signal generator 40 may generate the digital multi-bit signal by performing the serial or parallel conversion for each n×m-bit period, based on an n-bit-wide digital test signal input to one of the plurality of driver circuits. More specifically, the analog signal generator 40 may perform the serial or parallel conversion on the digital multi-bit signal input to the driver circuit 30-1 for each set of a number of bits corresponding to the number of levels of the analog test signal. More specifically, if the analog test signal has $2^{n \times m}$ levels, the analog signal generator 40 can perform the serial or parallel conversion on the digital test signal for each set of n×m bits.

For example, when generating the analog signal having $2^8 = 256$ levels, the analog signal generator 40 generates two 8-bit digital multi-bit signals "00001111" and "00110011" from the digital test signal whose data is "0000111100110011." The analog signal generator 40 may generate the analog test signal having a voltage value that corresponds to the generated digital multi-bit signal.

Figure 5:
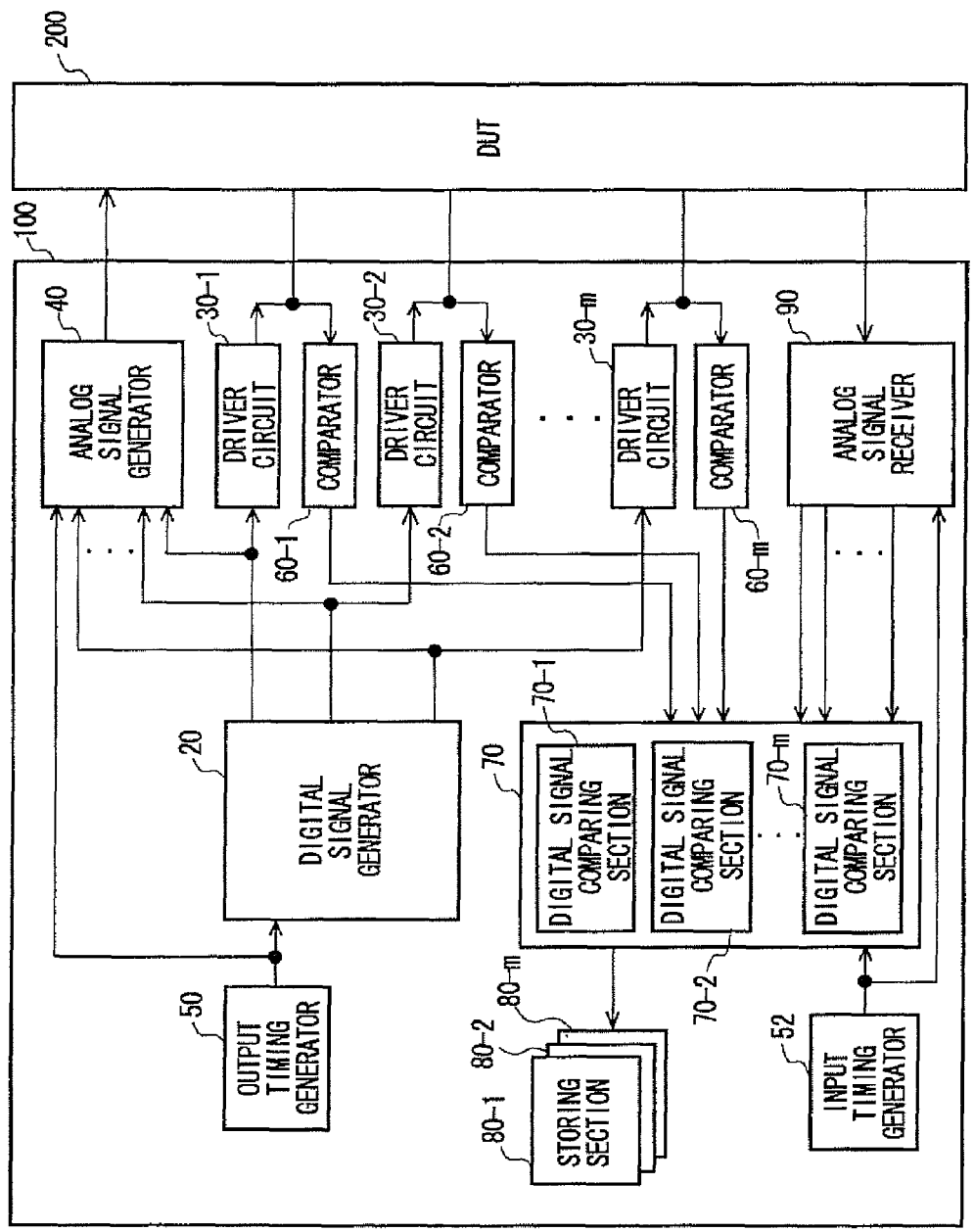
FIG. 5 shows another exemplary configuration of the test apparatus 100.

FIG. 5 shows another exemplary configuration of the test apparatus 100. In FIG. 5, the test apparatus 100 further includes an input timing generator 52, comparators 60-1 to 60-*m*, digital signal comparing sections 70-1 to 70-*m*, storage sections 80-1 to 80-*m*, and an analog signal receiver 90. Each comparator 60 is connected to a corresponding digital terminal of the device under test 200, along with a corresponding driver circuit 30.

The m comparators 60 receive the signals output from the digital terminals of the device under test 200, and output a comparison result between the voltage of the received signal and a threshold voltage. For example, each comparator 60 receives the digital signal output by the device under test 200 in response to the digital test signal output by the corresponding driver circuit 30. The comparator 60 may then output a comparison result with a logic value of 1 if the voltage of the received digital signal is greater than or equal to the threshold voltage and a logic value of 0 if the voltage of the received digital signal is less than the threshold voltage.

The m digital signal comparing sections 70 output comparison data obtained by comparing each comparison result to a prescribed expected value. For example, each digital signal comparing section 70 holds an expected value corresponding to the test pattern of the digital test signal generated by the digital signal generator 20, and sequentially compares the logic value of the comparison results received from the corresponding comparator 60 to this expected value. The digital signal comparing section 70 may generate comparison data that has a logic value of 0 when the comparison result matches the expected value and a logic value of 1 when the comparison result does not match the expected value.

Each storage section 80 stores the comparison data received from the corresponding digital signal comparing section 70. The test apparatus 100 may judge the acceptability of the device under test 200 based on the comparison data stored by the storage sections 80. For example, the test apparatus 100 may judge the device under test 200 to be acceptable when at least a prescribed percentage of the comparison data stored in the storage sections 80 indicates a match. The test apparatus 100 may judge the acceptability of a circuit that outputs a signal from a digital terminal of the device under test 200 based on the comparison data stored by the corresponding storage section 80.

The analog signal receiver 90 receives the analog signal output from the analog output terminal of the device under test 200, and converts the analog signal into a k×m-bit digitally-converted signal, where k is an integer greater than or equal to 1. More specifically, the analog signal receiver 90 samples the analog signal with a frequency that is at least double the frequency of the analog signal. The analog signal receiver 90 performs an analog/digital conversion on the sampled analog signal. The analog signal receiver 90 may perform the analog/digital conversion at an edge timing of an input timing signal generated by the input timing generator 52.

The analog signal receiver 90 converts the sampled analog signal into the digitally-converted signal having a prescribed number of levels. For example, if the prescribed number of levels is 256 and the voltage corresponding to a single level is 0.01 V, the analog signal receiver 90 converts an analog signal with a voltage in a range from 0 V to 2.55 V into an 8-bit digitally-converted signal. If the voltage value of the analog signal sampled by the analog signal receiver 90 is 1.28 V, the analog signal receiver 90 outputs the digitally-converted signal expressed as "10000000."

The analog signal receiver 90 inputs, to each the digital signal comparing sections 70, divided data obtained by dividing the digitally-converted signal into m portions. Here, m may be a value corresponding to the number of levels. More specifically, the analog signal receiver 90 may select m such that the value of $2^m$ equals the number of levels. In the case of the previous example, the analog signal receiver 90 sets m=8, and therefore divides the 8-bit digital data into 1-bit pieces and inputs these 1-bit pieces respectively to the digital signal comparing sections from 70-1 to 70-8.

Figure 6:
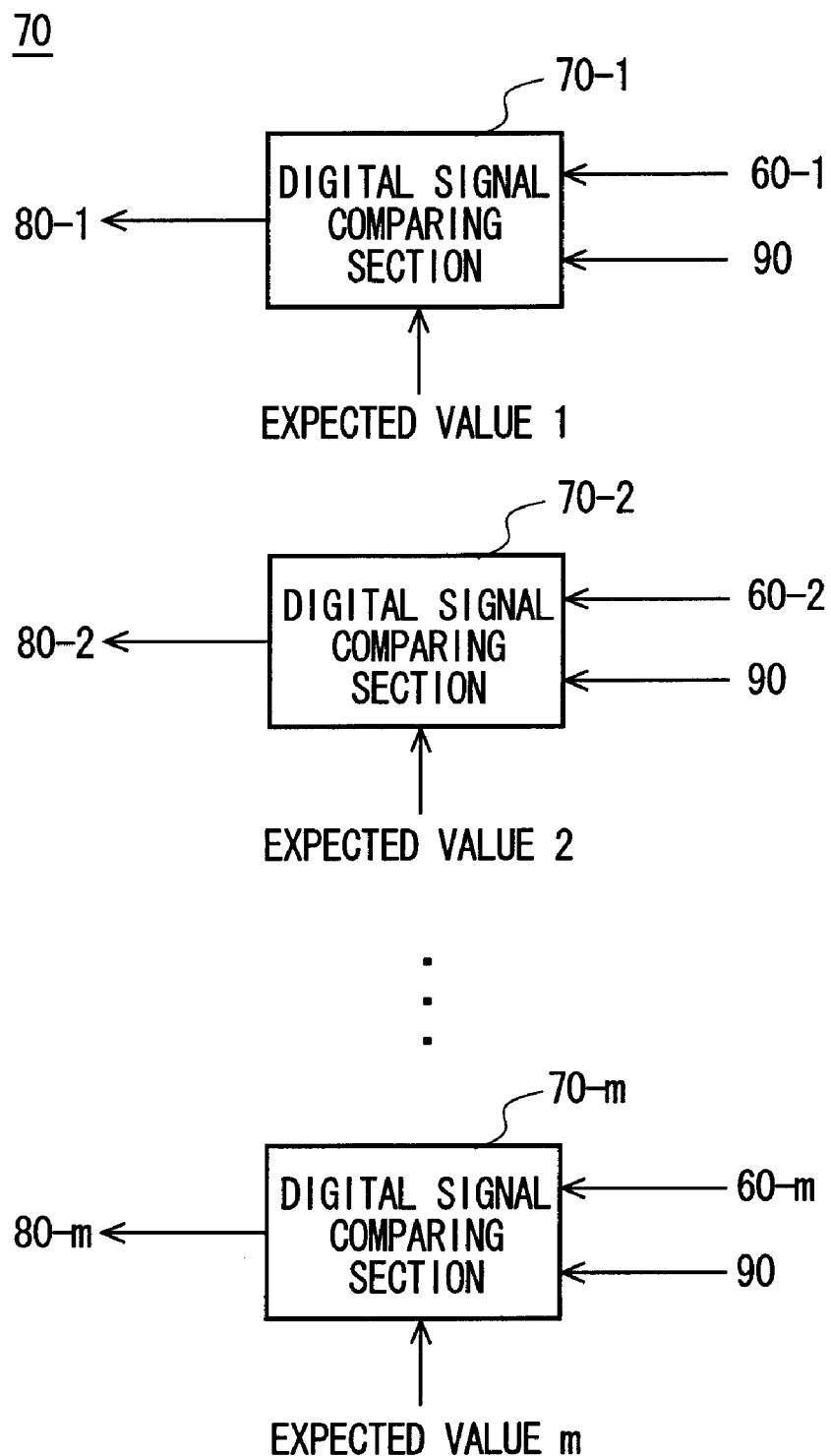
FIG. 6 shows another exemplary configuration of the digital signal comparing section 70.

FIG. 6 shows an exemplary configuration of a digital signal comparing section 70. Each digital signal comparing section 70 receives from the corresponding comparator 60 the comparison result between the prescribed threshold voltage and the voltage of the signal received from the device under test 200. Each digital signal comparing section 70 receives the corresponding divided data from the analog signal receiver 90.

Each digital signal comparing section 70 compares the received comparison result or divided data to the prescribed expected value. Each digital signal comparing section 70 stores the resulting comparison data in one of the storage sections 80. Each digital signal comparing section 70 may hold an expected value corresponding to the analog signal to be received from the device under test 200, and compare the divided data received from the analog signal receiver 90 to this expected value.

The digital signal comparing section 70 may determine the logic value of the comparison data stored in the storage section 80 based on whether the difference between the divided data and the prescribed expected value is within a prescribed range. The test apparatus 100 may judge the acceptability of an analog circuit in the device under test 200 based on the logic value of the comparison data stored in the storage sections 80.

The digital signal comparing section 70 may store the received divided data as-is in the storage section 80, without comparing the divided data to the expected value. In this case, the test apparatus 100 functions as a digitizer that analyzes the analog waveform input thereto.

The digital signal comparing section 70 may switch operation according to the type of data input thereto. For example, when receiving the digital signal output from a digital terminal of the device under test 200, the digital signal comparing section 70 may compare the received digital signal to a prescribed expected value and store the comparison data resulting from this comparison in the storage section 80. On the other hand, when receiving from the analog signal receiver 90 the digitally-converted signal corresponding to the analog signal output by the analog terminal of the device under test 200, the digital signal comparing section 70 may store the received digitally-converted signal in the storage section 80 without comparing the received signal to the prescribed expected value.

As described above, the test apparatus 100 can use the plurality of digital signal comparing sections 70 to store the analog signal output from the analog terminal of the device under test as digital data, and can measure or monitor the analog waveform. Accordingly, while restricting the circuit size, the test apparatus 100 can optimally distribute the ratio between the number of analog signals and the number of digital signals received simultaneously from the device under test 200, according to the test content of the device under test 200.

Figure 7:
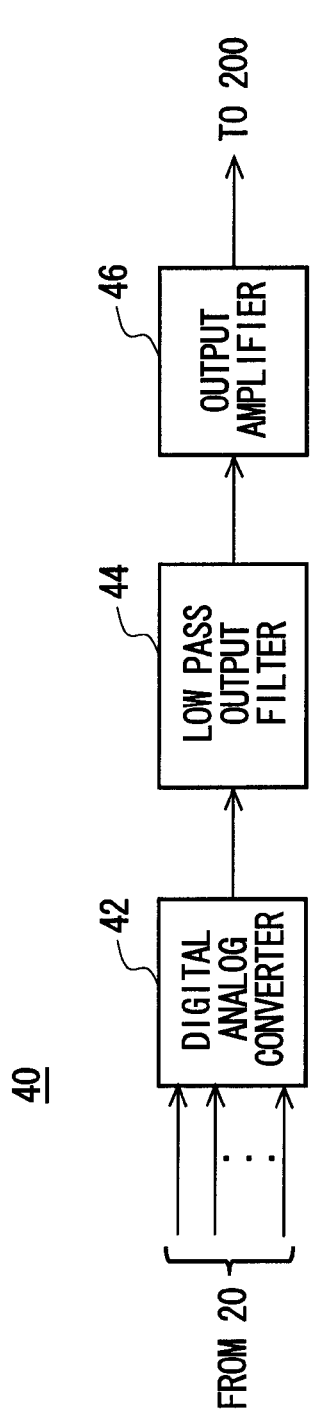
FIG. 7 shows another exemplary configuration of the analog signal generator 40.

FIG. 7 shows an exemplary configuration of the analog signal generator 40. The analog signal generator 40 includes a digital-analog converter 42, a low pass output filter 44, and an output amplifier 46. The digital-analog converter 42 converts the digital multi-bit signal into the analog test signal. The digital-analog converter 42 inputs the analog test signal to the analog input terminal of the device under test 200 via the low pass output filter 44.

The low pass output filter 44 removes a high frequency component of the analog test signal received from the digital-analog converter 42. The low pass output filter 44 may input the signal from which the high frequency component has been removed to the output amplifier 46. The output amplifier 46 amplifies the signal received from the low pass output filter 44, and inputs the resulting signal to the analog input terminal of the device under test 200.

Figure 8:
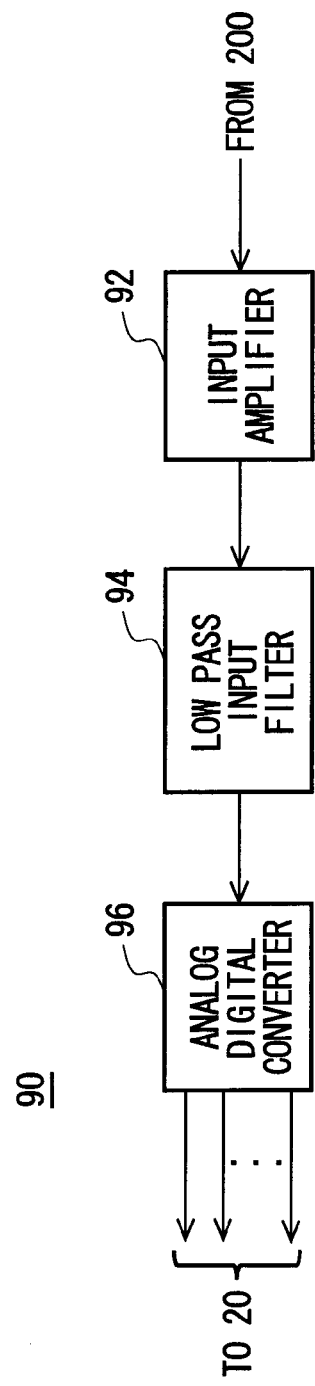
FIG. 8 shows another exemplary configuration of the analog signal receiver 90.

FIG. 8 shows an exemplary configuration of the analog signal receiver 90. The analog signal receiver 90 includes an input amplifier 92, a low pass input filter 94, and an analog-digital converter 96. The analog-digital converter 96 receives the analog signal output from the analog terminal of the device under test 200 via the low pass input filter 94. The analog-digital converter 96 converts the analog signal into the digitally-converted signal according to an input timing signal that is synchronized with the change timing of the logic value of the signal output from the digital terminal of the device under test 200.

The analog-digital converter 96 may sample the signals output from the digital terminals of the device under test 200 at an edge timing of the input timing signal generated by the input timing generator 52. The analog-digital converter 96 may convert the sampled analog signal into the digitally-converted signal having a number of bits corresponding to a prescribed number of levels.

Figure 9A:
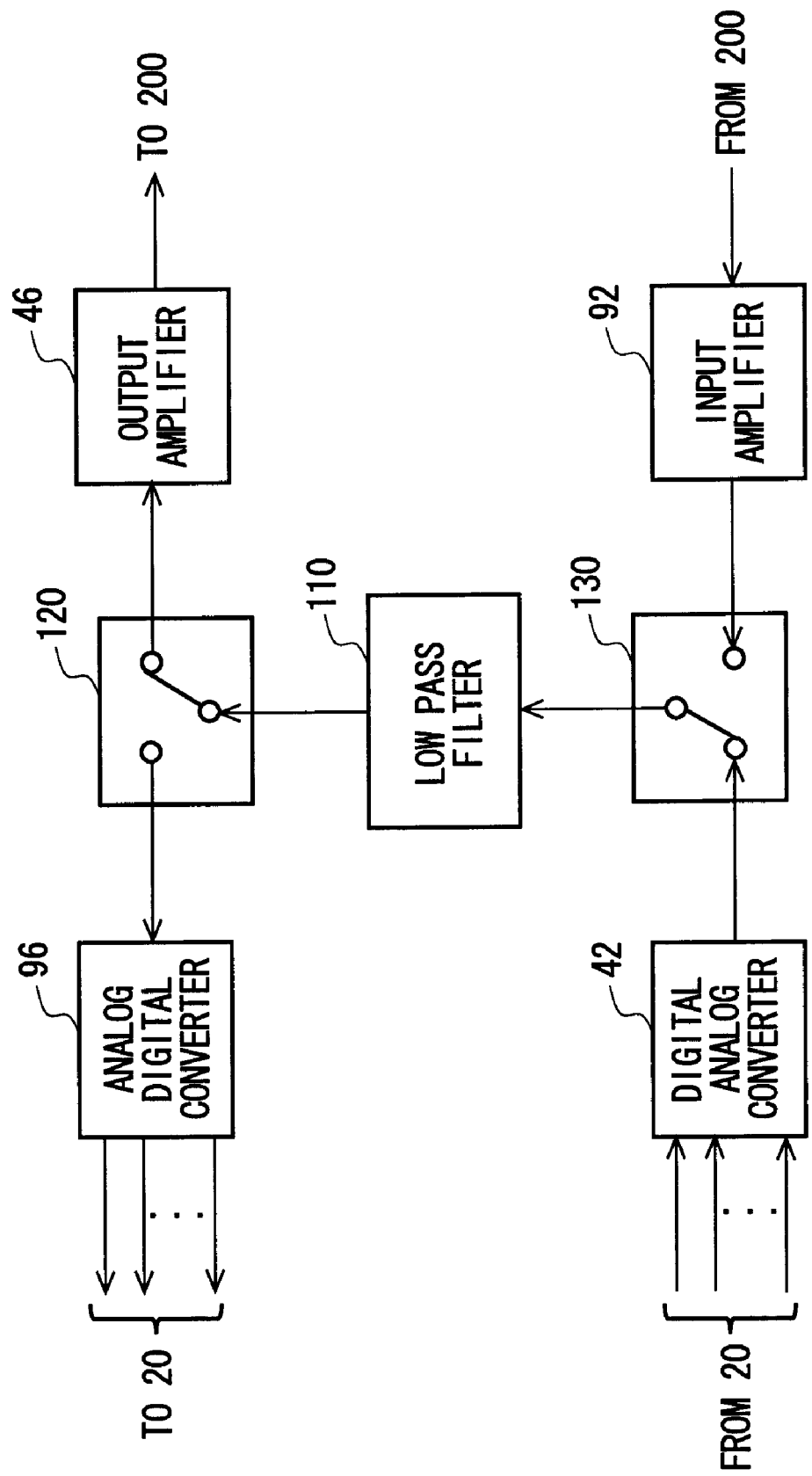
FIG. 9A shows another exemplary configuration of the analog signal generator 40 and the analog signal receiver 90.
Figure 9B:
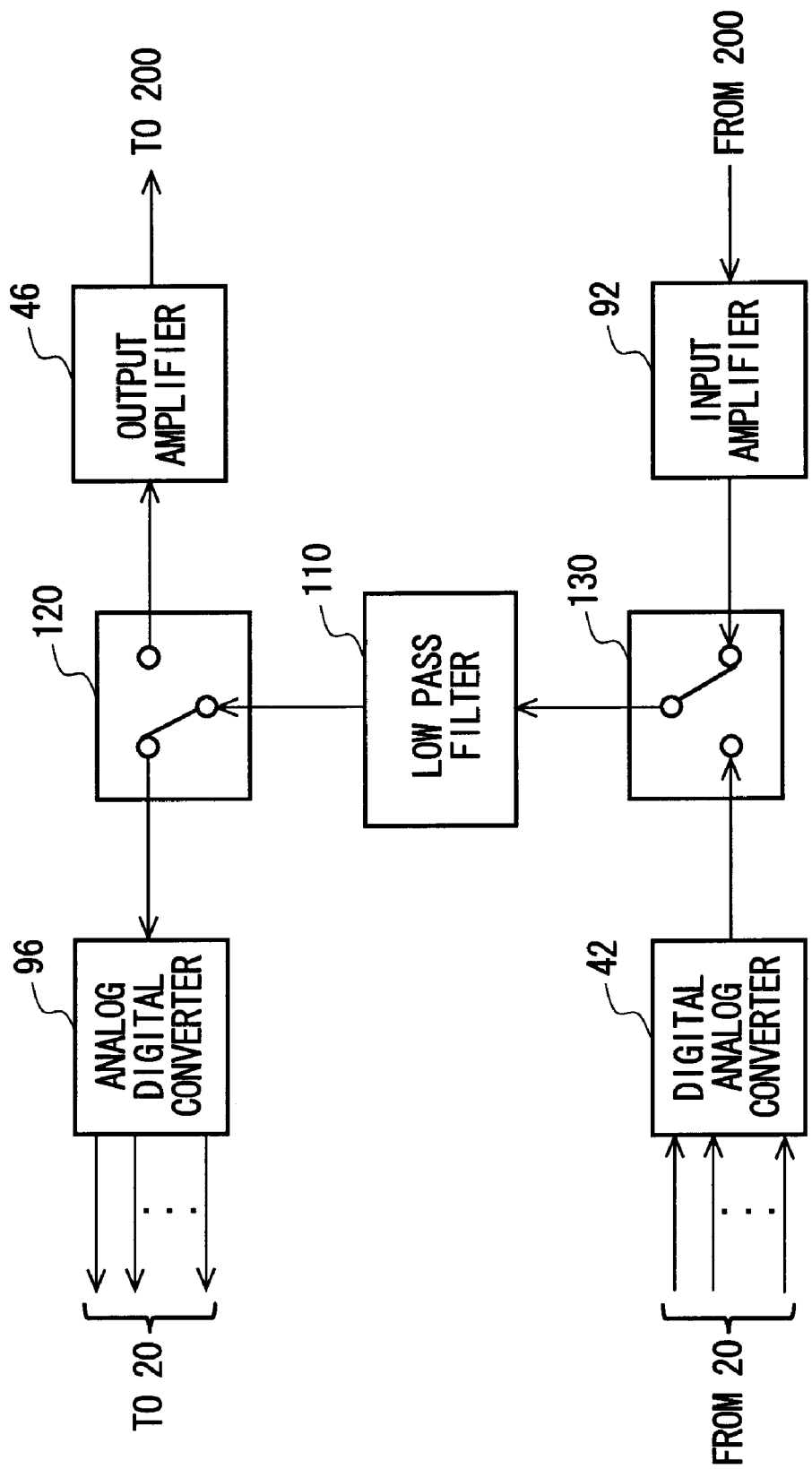
FIG. 9B shows another exemplary configuration of the analog signal generator 40 and the analog signal receiver 90.

FIGS. 9A and 9B show other exemplary configurations of the analog signal generator 40 and the analog signal receiver 90. In FIGS. 9A and 9B the analog signal generator 40 and the analog signal receiver 90 are provided with a low pass filter 110 that functions as the low pass output filter 44 and the low pass input filter 94.

When the analog signal generator 40 inputs the analog test signal to the analog terminal of the device under test 200, the low pass filter 110 receives the analog test signal output by the digital-analog converter 42 and outputs this signal to the analog terminal (FIG. 9A). When the analog signal receiver 90 receives the analog signal output from the analog terminal of the device under test 200, the low pass filter 110 receives the analog signal from the analog terminal and outputs this signal to the analog-digital converter (FIG. 9B).

In FIGS. 9A and 9B, the test apparatus 100 is further provided with an output switching section 120 and an input switching section 130. The input switching section 130 switches whether the output signal of the digital-analog converter 42 or the output signal of the analog terminal is input to the low pass filter 110. Furthermore, the output switching section 120 switches whether the signal output by the low pass filter 110 is input to the analog-digital converter 96 or to the analog terminal.

When the analog signal generator 40 inputs the analog test signal to the analog terminal, the input switching section 130 inputs the output signal of the digital-analog converter 42 into the low pass filter 110. The output switching section 120 then inputs the signal output by the low pass filter 110 into the analog terminal. When the analog signal receiver 90 receives the signal output by the analog terminal, the input switching section 130 inputs the output signal of the analog terminal to the low pass filter 110. The output switching section 120 then inputs the signal output by the low pass filter 110 into the analog-digital converter 96.

The test apparatus 100 may switch the polarity of the output switching section 120 and the input switching section 130 according to whether the analog test signal is being input to the analog terminal. By sharing the low pass filter 110 between the analog signal generator 40 and the analog signal receiver 90, the circuit size of the analog signal generator 40 and the analog signal receiver 90 decreases and the power consumption also drops.

Figure 9C:
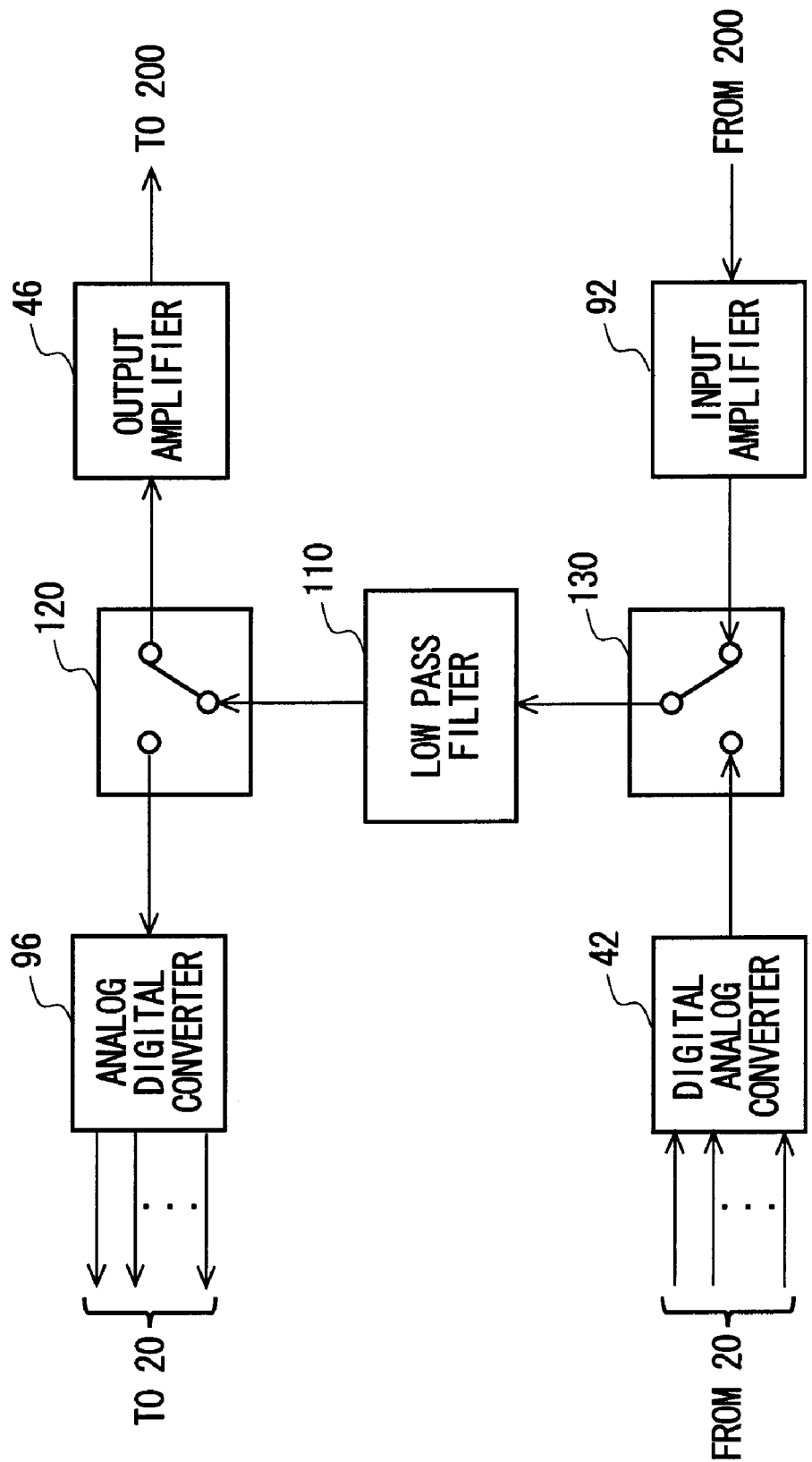
FIG. 9C shows another exemplary configuration of the analog signal generator 40 and the analog signal receiver 90.

FIG. 9C shows another exemplary configuration of the analog signal generator 40 and the analog signal receiver 90. By controlling the input switching section 130 and the output switching section 120, the test apparatus 100 can loop-back therein the signal output from the analog output terminal of the device under test 200 and input this signal to the analog input terminal of the device under test 200. With this configuration, the test apparatus 100 can perform a loop-back test of an analog circuit in the device under test 200.

Figure 10B:
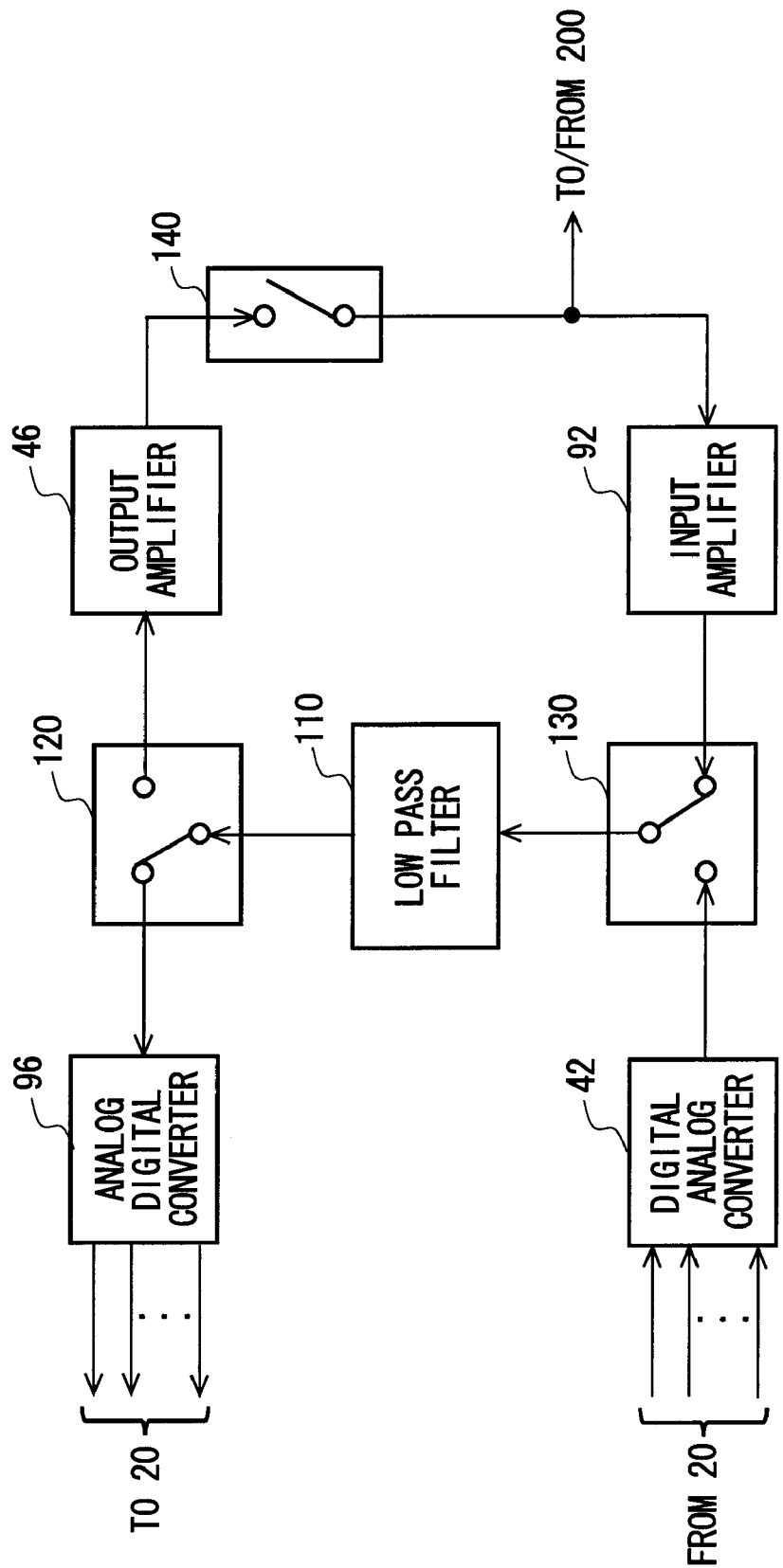
FIG. 10B shows another exemplary configuration of the analog signal generator 40 and the analog signal receiver 90.

FIGS. 10A and 10B show exemplary configurations of the analog signal generator 40 and the analog signal receiver 90. In FIGS. 10A and 10B, the test apparatus 100 is further provided with an input/output switching section 140. The input/output switching section 140 switches whether the analog signal generator 40 is connected to the analog terminal. When the input/output switching section 140 connects the analog signal generator 40 to the analog terminal, the input switching section 130 inputs the output signal of the digital-analog converter 42 into the low pass filter 110. Furthermore, the output switching section 120 inputs the signal output by the low pass filter 110 into the analog terminal (FIG. 10A).

When the input/output switching section 140 does not connect the analog signal generator 40 to the analog terminal, the input switching section 130 inputs the output signal of the analog terminal into the low pass filter 110. Furthermore, the output switching section 120 inputs the signal output by the low pass filter 110 into the analog-digital converter 96 (FIG. 10B). When the analog test signal is input to the device under test 200 and the analog signal output by the device under test 200 is received, the test apparatus 100 can test the device under test 200 via an analog input/output terminal by switching between the output switching section 120 and the input switching section 130 in synchronization with the input/output switching section 140.

Figure 11:
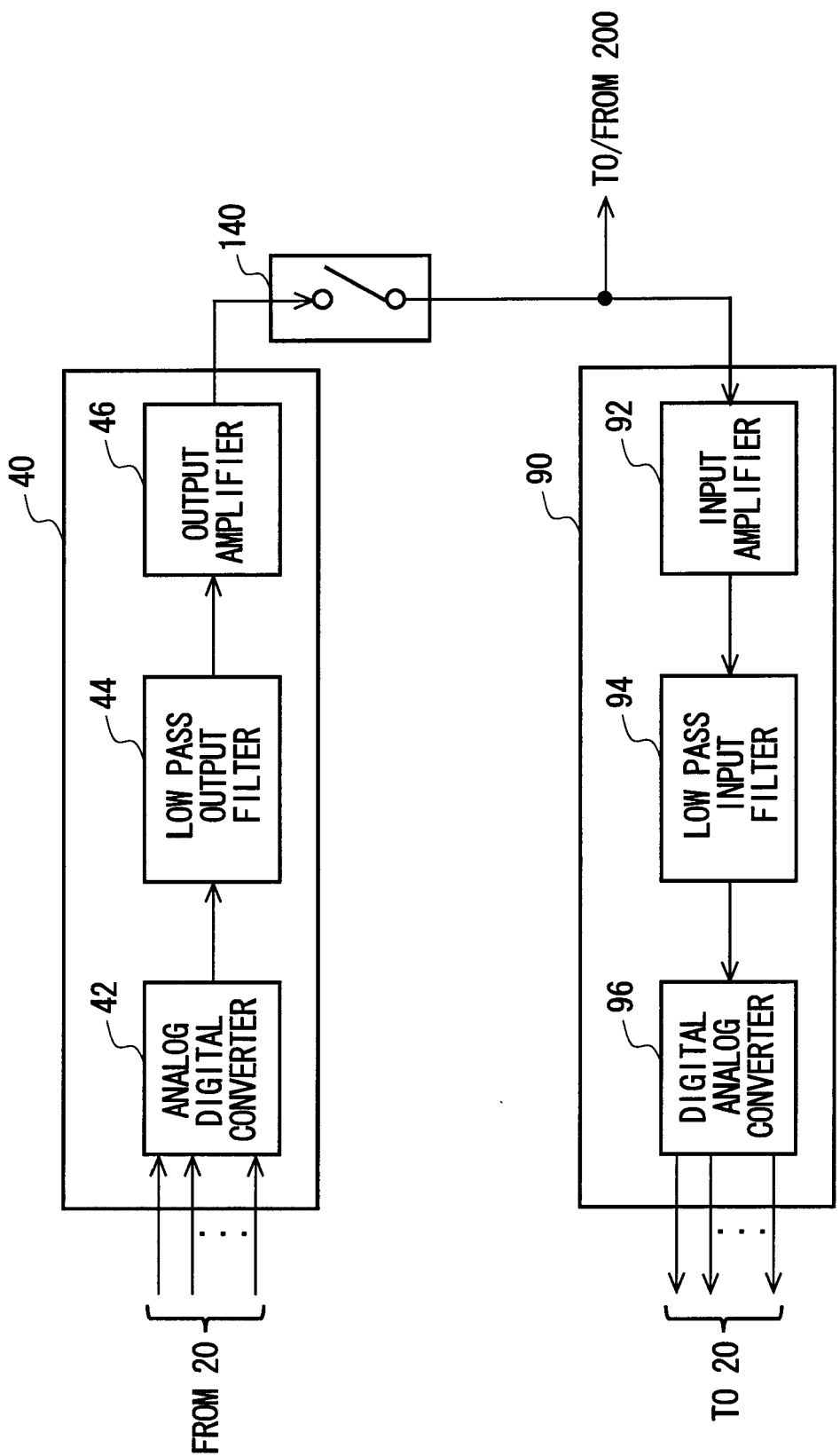
FIG. 11 shows another exemplary configuration of the analog signal generator 40 and the analog signal receiver 90.

FIG. 11 shows other exemplary configurations of the analog signal generator 40 and the analog signal receiver 90. In FIG. 11, the input/output switching section 140 switches whether the analog signal generator 40 is connected to the analog input/output terminal of the device under test 200.

When the test apparatus 100 inputs the analog test signal to the device under test 200, the input/output switching section 140 connects the analog signal generator 40 to the device under test 200. When the analog signal receiver 90 receives the analog signal output from the device under test 200, the input/output switching section 140 does not connect the analog signal generator 40 to the device under test 200.

The test apparatus 100 may loop-back the signal generated by the analog signal generator 40 to the analog signal receiver 90, via the input/output switching section 140. By inputting the looped-back analog signal to the digital signal comparing section 70, the test apparatus 100 can measure characteristics of the analog signal generated by the analog signal generator 40.

The test apparatus 100 may loop-back the analog signal having a prescribed frequency generated by the analog signal generator 40 to the analog signal receiver 90, and input the looped-back analog signal to the digital signal comparing section 70. By comparing the looped-back analog signal to a prescribed expected value, the test apparatus 100 can calibrate the analog signal generator 40 and the analog signal receiver 90.

As described above, while keeping a small circuit size, the test apparatus 100 can optimally distribute (i) the ratio between the number of digital test signals and the number of analog test signals output simultaneously from the device under test 200 and (ii) the ratio between the number of digital signals and the number of analog signals input simultaneously from the device under test 200, according to the test content of the device under test 200.

While the embodiments of the present invention has (have) been described, the technical scope of the invention is not limited to the above described embodiment(s). It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus and an electronic device that can test digital circuits and analog circuits.

What is claimed is:

1. A test apparatus that tests a device under test, comprising:
   a plurality of driver circuits that are connected respectively to a plurality of digital terminals of the device under test;
   a digital signal generator that outputs in parallel one or more n-bit digital test signals to the plurality of driver circuits, where n is an integer greater than or equal to 1; and
   an analog signal generator that generates an analog test signal by converting, into an analog signal, an n×m-bit digital multi-bit signal based on the one or more digital test signals output by the digital signal generator to the plurality of driver circuits, where m is an integer greater than or equal to 2.

2. The test apparatus according to claim 1, further comprising
   an output timing generator that generates an output timing signal that causes logic values of the one or more digital test signals to change, wherein the digital signal generator inputs the digital multi-bit signal to the analog signal generator and the plurality of driver circuits based on the output timing signal.

3. The test apparatus according to claim 2, wherein
   the analog signal generator acquires the output timing signal from the output timing generator and converts the digital multi-bit signal into the analog test signal at an edge timing of the output timing signal.

4. The test apparatus according to claim 1, wherein
   the analog signal generator converts the digital multi-bit signal into the analog test signal at an edge timing of one digital test signal from among the one or more digital test signals.

5. The test apparatus according to claim 1, wherein
   the analog signal generator converts the digital multi-bit signal into the analog test signal with a period that is 1/n times a bit period of the one or more digital test signals.

6. The test apparatus according to claim 1, wherein
   the analog signal generator generates the n×m-bit digital multi-bit signal, based on an n-bit-wide digital test signal input to one of the plurality of driver circuits.

7. The test apparatus according to claim 6, wherein
   the analog signal generator generates two or more n×m-bit digital multi-bit signals based on the n-bit-wide digital test signal input to one of the plurality of driver circuits.

8. The test apparatus according to claim 1, further comprising:
   a plurality of comparators that receive signals output from the digital terminals of the device under test and each output a comparison result between a voltage of the received signal and a prescribed threshold voltage;
   a plurality of digital signal comparing sections that each output comparison data obtained by comparing a respective comparison result to a prescribed expected value; and
   an analog signal receiver that (i) receives an analog signal output from an analog output terminal of the device under test, (ii) converts the analog signal into a k×m-bit digitally-converted signal, where k is an integer greater than or equal to 1, and (iii) inputs, to each of the plurality of digital signal comparing sections, divided data obtained by dividing the digitally-converted signal into m portions.

9. The test apparatus according to claim 8, further comprising:
   a plurality of storage sections that each store corresponding comparison data, wherein
   each digital signal comparing section stores the divided data in one or more of the plurality of storage sections.

10. The test apparatus according to claim 9, wherein
    the analog signal generator includes a digital-analog converter and a low pass output filter,
    the digital-analog converter converts the digital multi-bit signal into the analog test signal and inputs the analog test signal to an analog input terminal of the device under test via the low pass output filter,
    the analog signal receiver includes a low pass input filter and an analog-digital converter, and
    the analog-digital converter receives the analog signal output from the analog terminal of the device under test via the low pass input filter, and converts the analog signal into the digitally-converted signal according to an input timing signal that is synchronized with a logic value change timing of the signals output from the digital terminals.

11. The test apparatus according to claim 10, comprising a low pass filter that functions as the low pass output filter and the low pass input filter, wherein
    when the analog test signal is input to the analog terminal of the device under test, the low pass filter receives the analog test signal output from the digital-analog converter and outputs the analog test signal to the analog terminal, and
    when the analog signal output from the analog terminal of the device under test is received, the low pass filter receives the analog signal received from the analog terminal and outputs the analog signal to the analog-digital converter.

12. The test apparatus according to claim 11, further comprising:
    an input switching section that switches whether an output signal of the digital-analog converter or an output signal of the analog terminal is input to the low pass filter; and
    an output switching section that switches whether the signal output by the low pass filter is input to the analog-digital converter or to the analog terminal, wherein
    when the analog signal generator inputs the analog test signal to the analog terminal, the input switching section inputs the output signal of the digital-analog converter into the low pass filter and the output switching section inputs the signal output by the low pass filter into the analog terminal, and when the analog signal receiver receives the signal output by the analog terminal, the input switching section inputs the output signal of the analog terminal into the low pass filter and the output switching section inputs the signal output by the low pass filter into the analog-digital converter.

13. The test apparatus according to claim 12, further comprising an input/output switching section that switches whether the analog signal generator is connected to the analog terminal, wherein when the input/output switching section connects the analog signal generator to the analog terminal, the input switching section inputs the output signal of the digital-analog converter into the low pass filter and the output switching section inputs the signal output by the low pass filter into the analog terminal, and when the input/output switching section does not connect the analog signal generator to the analog terminal, the input switching section inputs the output signal of the analog terminal into the low pass filter and the output switching section inputs the signal output by the low pass filter into the analog-digital converter.

14. The test apparatus according to claim 8, further comprising:

a plurality of storage sections that each store corresponding comparison data, wherein each digital signal comparing section stores in one or more of the plurality of storage sections comparison data obtained by comparing the divided data to the prescribed expected value.

15. An electronic device comprising:

a plurality of driver circuits that are connected respectively to a plurality of digital terminals of a device under test;

a digital signal generator that outputs in parallel one or more n-bit digital test signals to the plurality of driver circuits, where n is an integer greater than or equal to 1; and an analog signal generator that generates an analog test signal by converting, into an analog signal, a n×m-bit digital multi-bit signal based on the one or more digital test signals output by the digital signal generator to the plurality of driver circuits, where m is an integer greater than or equal to 2.

16. A test apparatus comprising:

a plurality of comparators that receive signals output from digital terminals of a device under test and each output a comparison result between a voltage of the received signal and a prescribed threshold voltage;

a plurality of digital signal comparing sections that each output comparison data obtained by comparing a respective comparison result to a prescribed expected value; and an analog signal receiver that (i) receives an analog signal output from an analog output terminal of the device under test, (ii) converts the analog signal into a k×m-bit digitally-converted signal, where k is an integer greater than or equal to 1, and (iii) where m is an integer greater than or equal to 2 inputs, to each of the plurality of digital signal comparing sections, divided data obtained by dividing the digitally-converted signal into m portions.

17. The test apparatus according to claim 16, further comprising:

a plurality of storage sections that each store corresponding comparison data, wherein each digital signal comparing section stores the divided data in one or more of the plurality of storage sections.

18. The test apparatus according to claim 16, further comprising:

a plurality of storage sections that each store corresponding comparison data, wherein each digital signal comparing section stores in one or more of the plurality of storage sections comparison data obtained by comparing the divided data to the prescribed expected value.

* * * * *